United States Patent
Tan et al.

(10) Patent No.: US 9,143,028 B2
(45) Date of Patent: Sep. 22, 2015

(54) POWER SUPPLY SYSTEMS AND METHODS

(71) Applicants: F. Dong Tan, Irvine, CA (US); Kwang M. Yi, Los Angeles, CA (US)

(72) Inventors: F. Dong Tan, Irvine, CA (US); Kwang M. Yi, Los Angeles, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 14/517,695

(22) Filed: Oct. 17, 2014

(65) Prior Publication Data
US 2015/0069987 A1 Mar. 12, 2015

Related U.S. Application Data
(62) Division of application No. 13/584,514, filed on Aug. 13, 2012, now Pat. No. 8,937,468.

(51) Int. Cl.
| | |
|---|---|
| H03K 5/13 | (2014.01) |
| H02M 1/08 | (2006.01) |
| H02M 3/157 | (2006.01) |
| H02M 3/158 | (2006.01) |
| H03K 5/135 | (2006.01) |
| H03K 3/023 | (2006.01) |

(52) U.S. Cl.
CPC ............... *H02M 1/08* (2013.01); *H02M 3/157* (2013.01); *H02M 3/158* (2013.01); *H03K 5/135* (2013.01)

(58) Field of Classification Search
CPC ..... H02M 3/156; H03K 3/023; H03K 3/0231; H03K 3/0233; H03K 5/13
USPC ........... 323/288, 289; 327/291, 306; 331/143, 331/182, 183
See application file for complete search history.

(56) References Cited

U.S. PATENT DOCUMENTS

| | | | | |
|---|---|---|---|---|
| 3,895,315 | A | * | 7/1975 | Way ............................... 331/111 |
| 4,137,493 | A | * | 1/1979 | Smith ........................... 320/148 |
| 4,714,843 | A | * | 12/1987 | Smith .............................. 327/91 |
| 5,668,508 | A | * | 9/1997 | Pulvirenti et al. ............ 331/111 |
| 5,721,483 | A | | 2/1998 | Kolluri et al. |
| 5,796,257 | A | * | 8/1998 | Johns ............................ 324/520 |
| 5,905,368 | A | | 5/1999 | Kolluri et al. |
| 5,973,939 | A | | 10/1999 | Tan |

(Continued)

FOREIGN PATENT DOCUMENTS

| | | |
|---|---|---|
| CN | 201 789 416 U | 4/2011 |
| JP | H06 309044 A | 11/1994 |
| JP | 2006 166613 A | 6/2006 |

*Primary Examiner* — Gary L Laxton
(74) *Attorney, Agent, or Firm* — Tarolli, Sundhelm, Covell & Tummino LLP

(57) ABSTRACT

One example of generating a clock signal via an oscillator system includes increasing a first comparison voltage at a first comparison node from a first magnitude to a second magnitude in response to a clock signal. A second comparison voltage is increased at a second comparison node from the first magnitude to the second magnitude in response to the clock signal. The clock signal changes state in response to the second comparison voltage increasing to a magnitude that is greater than the first comparison voltage. The first comparison voltage decreases from the second magnitude to the first magnitude in response to the clock signal. The second comparison voltage decreases from the second magnitude to the first magnitude in response to the clock signal. The clock signal changes state in response to the second comparison voltage decreasing to a magnitude that is less than the first comparison voltage.

14 Claims, 5 Drawing Sheets

(56) References Cited

U.S. PATENT DOCUMENTS

| | | |
|---|---|---|
| 6,184,726 B1 * | 2/2001 | Haeberli et al. .............. 327/96 |
| 6,215,365 B1 * | 4/2001 | Kurkovskiy .................. 331/65 |
| 6,570,368 B2 | 5/2003 | Demizu |
| 7,170,269 B1 | 1/2007 | Doyle |
| 7,358,710 B2 | 4/2008 | Luo et al. |
| 7,368,959 B1 | 5/2008 | Xu et al. |
| 7,411,375 B2 | 8/2008 | Konrad et al. |
| 7,474,163 B1 * | 1/2009 | Wile et al. .................... 331/143 |
| 7,564,702 B2 | 7/2009 | Schlecht |
| 2003/0234635 A1 | 12/2003 | Currelly et al. |
| 2005/0184711 A1 | 8/2005 | Chen et al. |
| 2006/0208716 A1 | 9/2006 | Chapuis |
| 2007/0164715 A1 | 7/2007 | Zeng et al. |
| 2007/0182391 A1 | 8/2007 | Chapuis |
| 2008/0100393 A1 | 5/2008 | Nuytkens et al. |
| 2008/0298093 A1 | 12/2008 | Jin et al. |
| 2010/0001699 A1 | 1/2010 | Dragojevic |
| 2010/0109713 A1 | 5/2010 | Harriman |
| 2010/0201405 A1 | 8/2010 | Ahmad et al. |
| 2010/0315052 A1 | 12/2010 | Zambetti et al. |
| 2011/0025284 A1 | 2/2011 | Xu et al. |
| 2012/0039098 A1 | 2/2012 | Berghegger |
| 2014/0042812 A1 | 2/2014 | Tan |

* cited by examiner

POWER SUPPLY SYSTEMS AND METHODS

RELATED APPLICATIONS

This application is a divisional application of U.S. patent application Ser. No. 13/584,514, filed 13 Aug. 2012, which is incorporated herein in its entirety.

TECHNICAL FIELD

The present invention relates generally to electronic circuits, and specifically to power supply systems and methods.

BACKGROUND

There is an ever increasing demand for power conversion and regulation circuitry to operate with increased efficiency. One such type of regulator circuit is known as a switching regulator or switching power supply. A switching power supply controls the flow of power to a load by controlling the "on" and "off" duty-ratio of one or more transistor switches coupled to the load. One such way of controlling the "on" and "off" time of the one or more transistor switches is to generate a pulse-width-modulated (PWM) signal, such that the "on" and "off" time of the one or more transistor switches is determined by relative pulse-widths of the PWM signal. Switching power supplies have been implemented as an efficient mechanism for providing a regulated output. Many different classes of switching power supplies exist today. In addition, multiple power supplies can be incorporated together, such as to provide point-of-load (POL) power to a variety of loads or to provided redundancy in generating an output voltage.

SUMMARY

One aspect of the present invention includes a power supply system. The system includes an error amplifier system configured to generate an error voltage based on a feedback voltage associated with an output voltage of the power supply system relative to a reference voltage. The system also includes a pulse-width modulation (PWM) generator configured to generate a PWM signal based on the error voltage. The system also includes a power stage configured to generate the output voltage based on the PWM signal. The system further includes an output voltage tuning circuit configured to set a desired magnitude of the output voltage in response to at least one digital signal, the at least one digital signal being configured to set a magnitude of the reference voltage and to adjust a magnitude of the feedback voltage.

Another embodiment of the present invention includes a power supply system. The system includes an oscillator system configured to generate a clock signal at a clock node. The oscillator system includes a capacitor that is configured to be repeatedly charged and discharged based on a state of the clock signal and a comparator configured to compare a first voltage associated with the capacitor at a first comparator node and a second voltage at a second comparator node. The second voltage can have a magnitude that changes based on the state of the clock signal. The system also includes a PWM generator configured to generate a PWM signal based on an error voltage and the clock signal. The system further includes a power stage configured to generate an output voltage based on the PWM signal.

Another embodiment of the present invention includes a power supply system. The system includes an error amplifier system configured to generate an error voltage based on a feedback voltage of the power supply system relative to a reference voltage. The system also includes a PWM generator comprising a comparator configured to generate a PWM signal based on the error voltage and a ramp signal. The system further includes a power stage configured to generate the output voltage based on the PWM signal, the power stage comprising a transconductance amplifier configured to generate a temperature-compensated sense current associated with a magnitude of an output current associated with power stage. The ramp signal being generated based on the temperature-compensated sense current.

Another embodiment of the present invention includes a method for generating a clock signal via an oscillator system. The method includes providing a charging current via a first current path that interconnects a first comparison node and a clock node associated with the clock signal during a logic-high state of the clock signal and charging a capacitor via the charging current to generate a first comparison voltage at the first comparison node. The method also includes setting the clock signal to a logic-low state in response to the first comparison voltage being greater than the second comparison voltage and activating a discharge switch in response to the logic-low state of the clock signal to provide a second current path. The method further includes discharging the capacitor via the first current path and the second current path during the logic-low state of the clock signal and setting the clock signal to the logic-high state and deactivating the discharge switch in response to the second comparison voltage being greater than the first comparison voltage.

Another embodiment of the present invention includes a method for generating an output voltage via a power supply system. The method includes setting a magnitude of a reference voltage based on a value of at least one digital signal and adjusting a scale factor of a feedback voltage that is associated with the output voltage based on the at least one digital signal and generating an error voltage based on a magnitude of the feedback voltage associated with the output voltage relative to the reference voltage. The method further includes generating a PWM signal based on the error voltage and a clock signal and controlling at least one switch based on the PWM signal to generate the output voltage.

DETAILED DESCRIPTION

Figure 1:
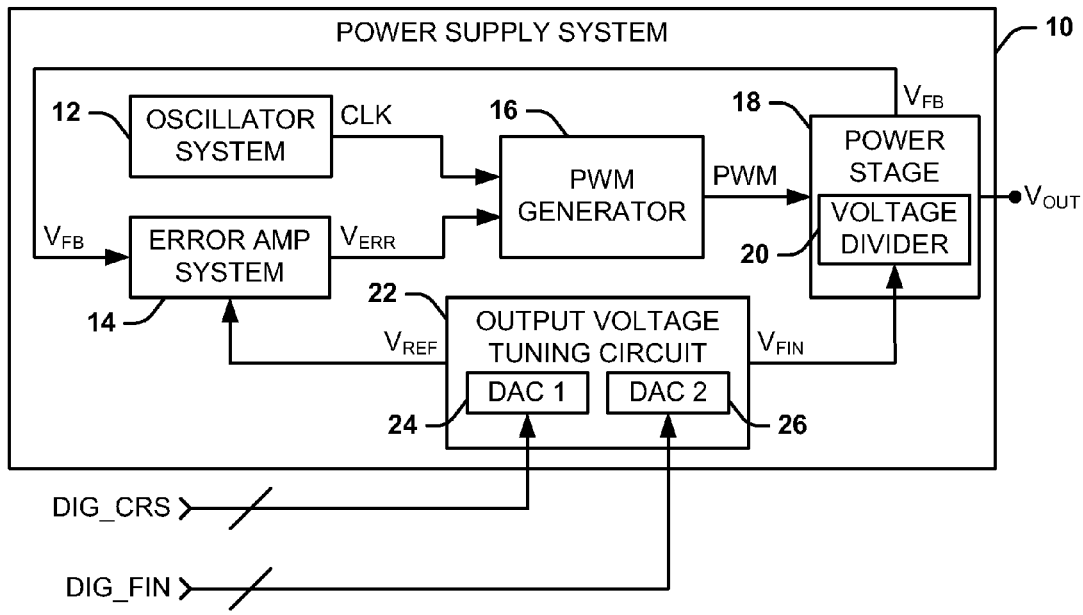
FIG. 1 illustrates an example of a power supply system in accordance with an aspect of the invention.

The present invention relates generally to electronic circuits, and specifically to power supply systems and methods. A power supply system can include an error amplifier system that can generate an error voltage based on a magnitude of a feedback voltage associated with an output voltage relative to a reference voltage. The power supply system can also include a pulse-width modulation (PWM) generator that can generate a PWM signal based on the error voltage and a clock signal that can be generated by an oscillator system. The system can further include a power stage that can generate the output voltage based on the PWM signal. As an example, the power stage can include at least one switch that is controlled based on a duty-cycle of the PWM signal to generate an output current through an inductor, such that the output voltage can be generated based on the output current.

As an example, the power stage can include a transconductance amplifier configured to generate a temperature-compensated sense current associated with a magnitude of the output current. The temperature-compensated sense current can be combined with a ramp voltage that can be generated based on the clock signal to generate a ramp signal. The PWM signal can thus be generated based on a comparison of the ramp signal with the error voltage. As described herein, the term "temperature-compensated" can refer to a magnitude of the sense current that is substantially insensitive to temperature variations, such that the temperature-compensated sense current can provide an indication of the magnitude of output current substantially independently of temperature variations.

As another example, the system can also include an output voltage tuning circuit that is configured to set a desired magnitude of the output voltage in response to at least one digital signal to adjust a magnitude of the reference voltage and the feedback voltage. For example, the at least one digital signal can include a first digital signal that is provided to a first digital-to-analog converter (DAC) that is configured to generate the reference voltage based on the value of the first digital signal. The at least one digital signal can also include a second digital signal that is provided to a second DAC that is configured to generate a fine adjust voltage based on the value of the second digital signal. The power stage can include a voltage divider configured to generate the feedback voltage, and can include at least one variable resistor. The fine adjust voltage can thus be provided to the at least one variable resistor to adjust the magnitude of the feedback voltage by adjusting the scale factor (i.e., proportionality) of the feedback voltage with respect to the output voltage.

The system can further include an oscillator system that generates the clock signal based on repeatedly charging and discharging a capacitor based on the clock signal. The oscillator system also includes a comparator that compares the capacitor voltage and a second voltage having a magnitude that changes based on the state of the clock signal. The capacitor can be charged via a first current path that interconnects a clock node on which the clock signal is generated and a first comparison node. The capacitor can be discharged via a switch that is activated at a logic-low state of the clock signal. Therefore, the capacitor can be discharged via both the first current path and a second current path that is provided through the switch during a logic-high state of the clock signal.

FIG. 1 illustrates an example of a power supply system 10 in accordance with an aspect of the invention. The power supply system 10 can be implemented in any of a variety of applications, such as for portable consumer devices, industrial applications, or for use in extreme temperature applications, such as part of a satellite payload or control system. For example, the power supply system 10 can be implemented as a backward compatible retrofit for existing analog-controlled power supply system designs, such as being implemented as an integrated circuit (IC) that can replace an on-board analog point-of-load (POL) power supply controller. The power supply system 10 is configured to generate an output voltage $V_{OUT}$. As an example, the power supply system 10 can be one of a plurality of power supplies, such as described in co-pending application, application Ser. No. 13/584,537, incorporated herein by reference in its entirety.

The power supply 10 includes an oscillator system 12, an error amplifier system 14, a pulse-width modulation (PWM) generator 16, and a power stage 18. The oscillator system 12 is configured to generate a clock signal CLK, which can be a digital pulse having a predefined frequency. The error amplifier system 14 is configured to generate an error voltage $V_{ERR}$ based on a reference voltage $V_{REF}$. The error amplifier system 14 can be configured to generate the error voltage $V_{ERR}$ based on a difference between the reference voltage $V_{REF}$ and a feedback voltage $V_{FB}$ associated with the output voltage $V_{OUT}$ provided from the power stage 18. In the example of FIG. 1, the power stage 18 includes a voltage divider 20 that is configured to generate the feedback voltage $V_{FB}$ to have a magnitude that is proportional to the output voltage $V_{OUT}$, such as by a scale factor that is less than one. Therefore, the error voltage $V_{ERR}$ can have a magnitude that corresponds to a difference between the output voltage $V_{OUT}$ and a desired magnitude of the output voltage $V_{OUT}$.

The clock signal CLK and the error voltage $V_{ERR}$ are each provided to the PWM generator 16. The PWM generator 16 can thus generate a switching signal PWM based on the clock signal CLK and the error voltage $V_{ERR}$. For example, the PWM generator 16 can include a comparator configured to compare the error voltage $V_{ERR}$ with a ramp signal associated with the clock signal CLK to generate the switching signal PWM having a duty-cycle that is proportional with the magnitude of the error voltage $V_{ERR}$. The switching signal PWM can thus be provided to the power stage 18 for control of one or more switches based on a duty-cycle of the switching signal PWM for generation of the output voltage $V_{OUT}$. The output voltage $V_{OUT}$ can thus provide power for a load, which can include any of a variety of devices in an associated computer system.

In the example of FIG. 1, the power supply system 10 also includes an output voltage tuning circuit 22 that is configured to control a magnitude of the output voltage $V_{OUT}$. The output voltage tuning circuit 22 comprises a first digital-to-analog converter (DAC) 24 and a second DAC 26. The first DAC 24 is configured to generate the reference voltage $V_{REF}$ in response to a value of a first digital signal DIG_CRS. For example, the first digital signal DIG_CRS can be a multi-bit digital signal having a value that corresponds to an approximate magnitude of the reference voltage $V_{REF}$, such that the first digital signal DIG_CRS can correspond to a coarse adjustment to the magnitude of the output voltage $V_{OUT}$. For example, the reference voltage $V_{REF}$ can have a substantially wide range of different magnitudes at each increment of the digital signal DIG_CRS, such that, based on the scale factor between the feedback voltage $V_{FB}$ and the output voltage $V_{OUT}$, each increment of the reference voltage $V_{REF}$ can have a relatively larger resultant effect on the output voltage $V_{OUT}$.

In a similar manner, the second DAC 26 is configured to generate a fine adjust voltage $V_{FIN}$ in response to a value of a second digital signal DIG_FIN. In the example of FIG. 1, the fine adjust voltage $V_{FIN}$ is provided to the voltage divider 20 in the power stage 18. As an example, the voltage divider 20 can include at least one variable resistor, such that the fine adjust voltage $V_{FIN}$ can be provided to the at least one variable resistor to set a resistance value of the at least one variable resistor. For example, the second digital signal DIG_FIN can thus be a multi-bit digital signal having a value that corresponds to an approximate magnitude of the scale factor between the feedback voltage $V_{FB}$ and the output voltage $V_{OUT}$, such that the second digital signal DIG_FIN can correspond to a fine adjustment to the magnitude of the output voltage $V_{OUT}$. For example, the feedback voltage $V_{FB}$ can have a relatively small impact on the resistance of the at least one variable resistor in the voltage divider 20, such that each increment of the fine adjust voltage $V_{FIN}$ can have a relatively smaller resultant effect on the output voltage $V_{OUT}$. While the output voltage tuning circuit 22 is demonstrated in the example of FIG. 1 as including the DACs 24 and 26, it is to be understood that the output voltage tuning circuit 22 could instead receive one or more analog voltage signals that are either converted or passed directly to the error amplifier system 14 and the voltage divider 20, respectively, for coarse and fine adjustment of the output voltage $V_{OUT}$.

Figure 2:
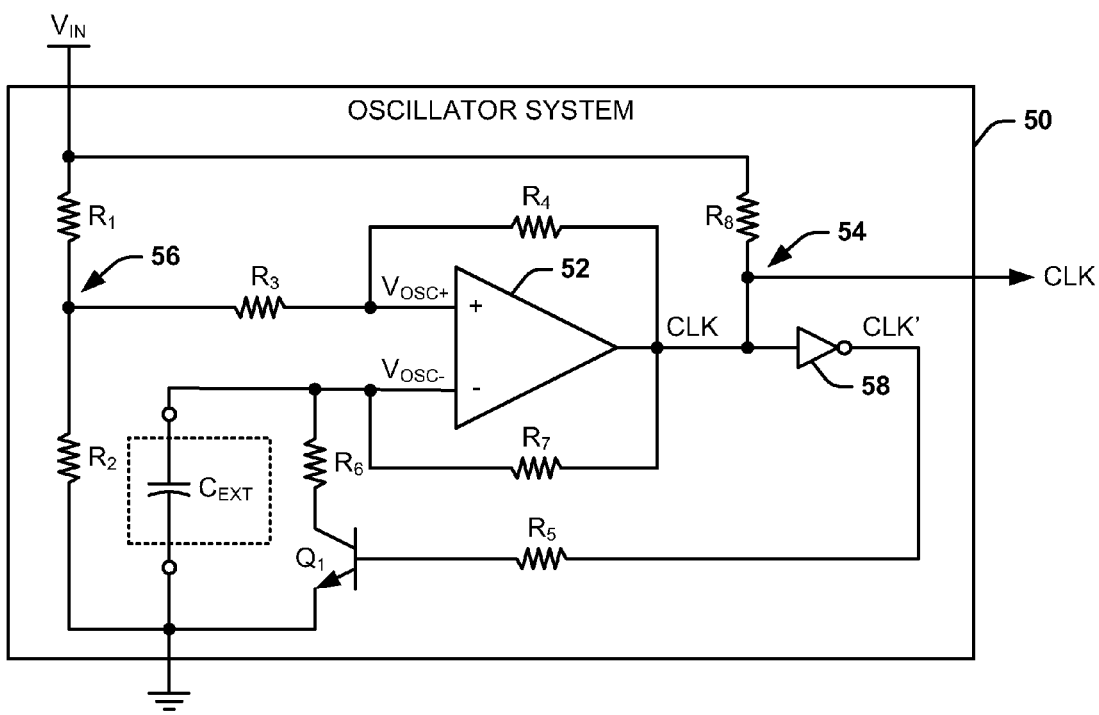
FIG. 2 illustrates an example of an oscillator system in accordance with an aspect of the invention.

FIG. 2 illustrates an example of an oscillator system 50 in accordance with an aspect of the invention. The oscillator system 50 can correspond to the oscillator system 12 in the example of FIG. 1. Therefore, reference is to be made to the example of FIG. 1 in the following description of the example of FIG. 2. As an example, the oscillator system 50 can be incorporated into an integrated circuit (IC).

The oscillator system 50 includes a comparator 52 that is configured to generate the clock signal CLK at a clock node 54 corresponding to an output of the comparator 52. The clock signal CLK can thus correspond to a digital pulse based on a relative magnitude of the voltage at each of an inverting input and a non-inverting input of the comparator 52. In the example of FIG. 2, the comparator 52 compares a first comparison voltage $V_{OSC+}$ at a non-inverting input and a second comparison voltage $V_{OSC-}$ at an inverting input. Therefore, the clock signal CLK has a logic-high state in response to the first comparison voltage $V_{OSC+}$ being greater than the second comparison voltage $V_{OSC-}$, and the clock signal CLK has a logic-low state in response to the second comparison voltage $V_{OSC-}$ being greater than the first comparison voltage $V_{OSC+}$.

In the example of FIG. 2, the oscillator system 50 is powered by an input voltage $V_{IN}$, which can be a variety of DC power voltage magnitudes (e.g., 12 volts). The input voltage $V_{IN}$ is voltage-divided by a resistor $R_1$ interconnecting the input voltage $V_{IN}$ and an intermediate node 56 and a resistor $R_2$ interconnecting the intermediate node 56 and a low voltage rail, demonstrated in the example of FIG. 2 as ground. A resistor $R_3$ interconnects the intermediate node 56 and the non-inverting input of the comparator 52. Therefore, the first comparison voltage $V_{OSC+}$ has a magnitude at the logic-high state of the clock signal CLK that is based on the magnitude of the input voltage $V_{IN}$ and the resistance of the resistors $R_1$, $R_2$, and $R_3$. However, the oscillator system 50 also includes a first feedback current path that includes a resistor $R_4$ interconnecting the clock node 54 and the non-inverting input of the comparator 52. Therefore, upon the second comparison voltage $V_{OSC-}$ being greater than the first comparison voltage $V_{OSC+}$, the output of the comparator 52 is configured to sink current from the clock node 54 through the first feedback current path via the resistor $R_4$ to maintain the logic-low state of the clock signal CLK. Accordingly, the magnitude of the first comparison voltage $V_{OSC+}$ is substantially reduced during the logic-low state of the clock signal CLK.

The oscillator system 50 also includes an inverter 58 that is configured to invert the clock signal CLK to generate a signal CLK'. The signal CLK' is provided to a base of a transistor $Q_1$, demonstrated in the example of FIG. 2 as an NPN bipolar junction transistor (BJT), via a resistor $R_5$ to control activation of the transistor $Q_1$. The transistor $Q_1$ is coupled to ground at the emitter and coupled to a resistor $R_6$ that interconnects the inverting input of the comparator 52 and the collector of the transistor $Q_1$. In addition, the oscillator system 50 includes a capacitor $C_{EXT}$ that interconnects the inverting input of the comparator 52 and ground, and a second feedback current path that includes a resistor $R_7$ that interconnects the clock node 54 and the inverting input of the comparator 52. Furthermore, the oscillator system 50 includes a resistor $R_8$ that interconnects the input voltage $V_{IN}$ and the clock node 54.

In the example of FIG. 2, when the comparator 52 provides the clock signal CLK at a logic-high state, the first comparison voltage $V_{OSC+}$ has a substantially higher magnitude, as described previously. In addition, the signal CLK' has a logic-low state, such that the transistor $Q_1$ is deactivated. Thus, during the logic-high state of the clock signal CLK, the capacitor $C_{EXT}$ is charged via a current path from the input voltage $V_{IN}$, through the resistor $R_8$, and through the second feedback path via the resistor $R_7$. As a result, the rate at which the capacitor $C_{EXT}$ is charged depends on the resistance values of the resistors $R_8$ and $R_7$, as well as the capacitance value of the capacitor $C_{EXT}$. As the capacitor $C_{EXT}$ charges, the magnitude of the second comparison voltage $V_{OSC-}$ begins to increase.

Upon the magnitude of the second comparison voltage $V_{OSC-}$ increasing to a magnitude that is greater than the first comparison voltage $V_{OSC+}$, the comparator 52 switches the clock signal CLK to the logic-low state. In response, the signal CLK' switches to a logic-high state via the inverter 58, which activates the transistor $Q_1$ via the resistor $R_5$. Therefore, the capacitor $C_{EXT}$ begins to discharge via two separate current paths. In the example of FIG. 2, the first current path is from the capacitor $C_{EXT}$ through the resistor $R_6$ and the activated transistor $Q_1$ to ground, and the second current path is from the capacitor $C_{EXT}$ through the second feedback path via the resistor $R_7$ to the clock node 54 to the output of the comparator 52 which sinks current during the logic-low state of the clock signal CLK, as described previously. Therefore, the rate at which the capacitor $C_{EXT}$ discharges depends on the resistance values of the resistors $R_6$ and $R_7$, as well as the capacitance value of the capacitor $C_{EXT}$. Accordingly, because the capacitor $C_{EXT}$ discharges via two current paths (e.g., the resistors $R_6$ and $R_7$), the capacitor $C_{EXT}$ can discharge more rapidly during the logic-low state of the clock signal CLK than it charges via the single current path (e.g., the resistor $R_7$). As a result of the discharging of the capacitor $C_{EXT}$, the second comparison voltage $V_{OSC-}$ begins to decrease. As described previously, the first comparison voltage $V_{OSC+}$ decreases during the logic-low state of the clock signal CLK. Accordingly, upon the magnitude of the second comparison voltage $V_{OSC-}$ decreasing to a magnitude that is less than the first comparison voltage $V_{OSC+}$, the comparator 52 switches the clock signal CLK back to the logic-high state.

Figure 3:
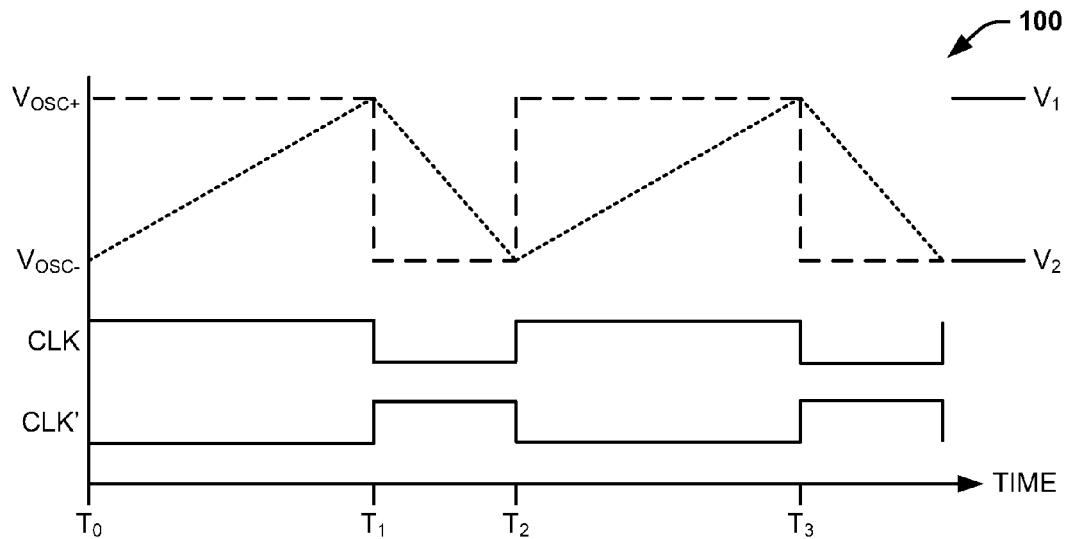
FIG. 3 illustrates an example of a timing diagram in accordance with an aspect of the invention.

FIG. 3 illustrates an example of a timing diagram 100 in accordance with an aspect of the invention. The timing diagram 100 can correspond to operation of the oscillator system 50 in the example of FIG. 2. The timing diagram 100 includes the clock signal CLK, the signal CLK', the first comparison voltage $V_{OSC+}$, and the second comparison voltage $V_{OSC-}$. Therefore, reference is to be made to the example of FIG. 2 in the following description of the example of FIG. 3.

At a time $T_0$, the clock signal CLK has a logic-high state. Therefore, the signal CLK' has a logic-low state via the inverter 58, which deactivates the transistor $Q_1$, the first comparison voltage $V_{OSC+}$ has a relatively larger magnitude, demonstrated in the example of FIG. 3 as a voltage $V_1$, and the second comparison voltage $V_{OSC-}$ begins to increase based on being charged via the single charging current path from the input voltage $V_{IN}$ through the resistors $R_8$ and $R_7$. At a time $T_1$, the second comparison voltage $V_{OSC-}$ increases to a magnitude that is greater than the first comparison voltage $V_{OSC+}$ (e.g., greater than the voltage $V_1$). In response, the comparator 52 switches the clock signal to a logic-low state. Therefore, the signal CLK' switches to a logic-high state via the inverter 58, which activates the transistor $Q_1$ via the resistor $R_5$. In addition, the first comparison voltage $V_{OSC+}$ decreases to a relatively smaller magnitude, demonstrated in the example of FIG. 3 as a voltage $V_2$, based on current sinking into the output of the comparator 52 through the first feedback current path via the resistor $R_4$. The second comparison voltage $V_{OSC-}$ thus begins to decrease based on the discharging of the capacitor $C_{EXT}$ through the first discharging current path through the resistor $R_6$ and the transistor $Q_1$ and the second discharging current path through the second feedback current path via the resistor $R_7$ and into the output of the comparator 52.

Because the capacitor $C_{EXT}$ is charged via a single charging current path and is discharged via two separate current paths, the capacitor $C_{EXT}$ can discharge at a more rapid rate than it charges. Accordingly, as demonstrated in the example of FIG. 3, the second comparison voltage $V_{OSC-}$ increases at a substantially slower rate than it decreases. As a result, the clock signal CLK has a duty-cycle that is substantially greater than 50%. At a time $T_2$, the second comparison voltage $V_{OSC-}$ decreases to a magnitude that is less than the first comparison voltage $V_{OSC+}$. In response, the comparator 52 switches the clock signal CLK back to the logic-high state. Therefore, the first comparison voltage $V_{OSC+}$ increases back to the substantially higher magnitude, and the second comparison voltage $V_{OSC-}$ begins to slowly increase based on the charging of the capacitor $C_{EXT}$ via the single current path, similar to as described previously. At a time $T_3$, the second comparison voltage $V_{OSC-}$ increases to a magnitude that is greater than the first comparison voltage $V_{OSC+}$ again. In response, the comparator 52 switches the clock signal CLK back to the logic-low state. Therefore, the first comparison voltage $V_{OSC+}$ decreases back to the substantially lower magnitude, and the second comparison voltage $V_{OSC-}$ begins to more rapidly slowly decrease based on the discharging of the capacitor $C_{EXT}$ through the two current paths, similar to as described previously.

It is to be understood that the timing diagram 100 is not limited to the example of FIG. 3. For example, the timing diagram 100 is demonstrated in the example of FIG. 3 as an ideal timing diagram, and thus it is to be understood that the magnitudes of the clock signal CLK, the signal CLK', the first comparison voltage $V_{OSC+}$, and the second comparison voltage $V_{OSC-}$ may not be linear. As an example, in the timing diagram 100, at each transition of the clock signal CLK and the signal CLK', the voltages $V_{OSC+}$ and $V_{OSC-}$ are demonstrated as equal, but it is to be understood that the second comparison voltage $V_{OSC-}$ may be slightly greater than the first comparison voltage $V_{OSC+}$ at the times $T_1$ and $T_3$ and may be slightly less than the first comparison voltage $V_{OSC-}$ at the time $T_2$. In addition, the transitions of the first comparison voltage $V_{OSC+}$, as well as the clock signal CLK and the signal CLK', may be asymptotic and may include dead-times, as opposed to substantially instantaneous as demonstrated in the example of FIG. 3, and may include slight delays relative to each other.

Referring back to the example of FIG. 3, as described previously, the oscillator system 50 can be configured to be included as part of or entirely as an IC. Therefore, the resistors $R_1$ through $R_8$ can be integral to the circuit design of the oscillator system 50, and thus can be static in value. However, because of the characteristics of the oscillator system 50 to charge the capacitor $C_{EXT}$ via a single current path and to discharge the capacitor $C_{EXT}$ via two current paths, and because the comparator 52 compares the second comparison voltage $V_{OSC-}$ to a dynamic magnitude of the first comparison voltage $V_{OSC+}$, the oscillator system 50 can have a frequency that is tunable based solely on the capacitance value of the capacitor $C_{EXT}$. Therefore, the capacitor $C_{EXT}$ can be configured as an external capacitor that can be interchangeable to set a frequency of the clock signal CLK to a desired value. In other words, because the rates of both increase and decrease of the second comparison voltage $V_{OSC-}$ are based on the capacitance value of the capacitor $C_{EXT}$, the frequency of the clock signal CLK can be tuned absent additional circuit components beyond the capacitor $C_{EXT}$, as opposed to typical oscillator systems that also implement frequency tuning based on an external resistor that sets a magnitude of a charging current of an external capacitor. Accordingly, the oscillator system 50 can implement single-capacitor frequency setting, as opposed to typical oscillator systems that may require additional circuit components for setting the frequency. For example, typical frequency tuning implementations can utilize frequency tuning based on a product of an external resistance and an external capacitance, and a dead-time setting based on a ratio of the external resistance over the external capacitance. Therefore, the oscillator system 50 includes only a single capacitor, the external capacitor $C_{EXT}$, to utilize a much more simple and adaptable implementation that is less expensive and occupies less space.

Figure 4:
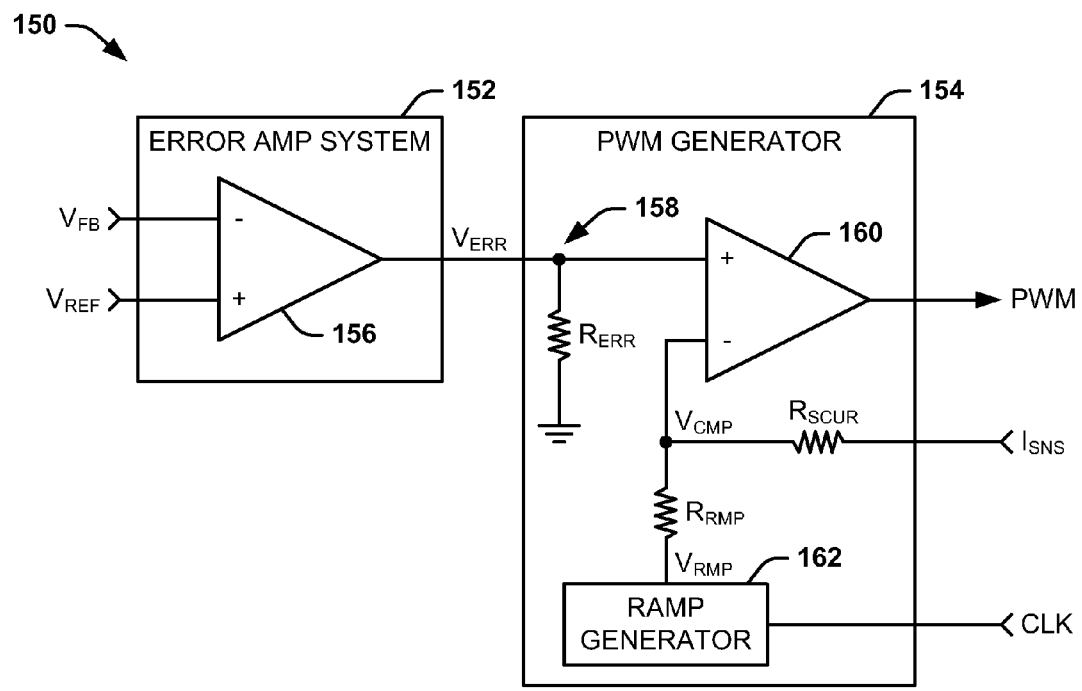
FIG. 4 illustrates an example of a power supply circuit in accordance with an aspect of the invention.

FIG. 4 illustrates an example of a power supply circuit 150 in accordance with an aspect of the invention. The power supply circuit 150 includes an error amplifier system 152 and a PWM generator 154. The power supply circuit 150 can correspond to the power supply system 10, such that the error amplifier system 152 can correspond to the error amplifier system 14 and the PWM generator 154 can correspond to the PWM generator 16 in the example of FIG. 1. Therefore, reference is to be made to the example of FIG. 1 in the following description of the example of FIG. 4.

The error amplifier system 152 includes an error amplifier 156. The error amplifier 156 is configured to compare the reference voltage $V_{REF}$ with the feedback voltage $V_{FB}$ and to provide an error voltage $V_{ERR}$ having a magnitude that is based on a difference between the reference voltage $V_{REF}$ and the feedback voltage $V_{FB}$. As an example, the feedback voltage $V_{FB}$ can have a magnitude that is proportional to the output voltage $V_{OUT}$ of the power supply system 10. The error voltage $V_{ERR}$ thus has a magnitude that is based on the difference between the reference voltage $V_{REF}$ and the feedback voltage $V_{FB}$ for maintaining the magnitude of the output voltage $V_{OUT}$ at a predetermined magnitude, as described in greater detail herein. In addition, it is to be understood that the error amplifier system 152 can include additional circuit components, such as one or more compensation circuit components interconnecting the error voltage $V_{ERR}$ and the feedback voltage $V_{FB}$, such as to act as a low-pass filter for the error voltage $V_{ERR}$.

As described previously in the example of FIG. 1, the magnitudes of the reference voltage $V_{REF}$ and the feedback voltage $V_{FB}$ can be based on at least one digital signal for coarse and fine adjustment of the output voltage $V_{OUT}$. For example, the reference voltage $V_{REF}$ can be generated by the first DAC 24 based on a first digital signal DIG_CRS. As another example, the feedback voltage $V_{FB}$ can be generated by the voltage divider 20, which can include at least variable resistor having a resistance that is set based on the fine adjust voltage $V_{FIN}$ that is generated by the second DAC 26 based on a second digital signal DIG_FIN. Accordingly, the error amplifier system 152 can generate the error voltage $V_{ERR}$ based on comparing the coarse and fine settings of the reference voltage $V_{REF}$ and the feedback voltage $V_{FB}$ to maintain a substantially desirable magnitude of the output voltage $V_{OUT}$.

The error voltage $V_{ERR}$ can be provided to a comparison node 158 in the PWM generator 54 that is separated from a low voltage rail, demonstrated in the example of FIG. 4 as ground, by a resistor $R_{ERR}$. The PWM generator 154 includes a comparator 160 configured to compare the error voltage $V_{ERR}$ and a ramp signal, demonstrated in the example of FIG. 4 as a voltage $V_{CMP}$. In the example of FIG. 4, the PWM generator 154 includes a ramp generator 162 that is configured to generate a ramp voltage $V_{RMP}$ based on the clock signal CLK. The PWM generator 154 also receives a sense current $I_{SNS}$ that can correspond to a magnitude of the output current of the power stage 18, as described in greater detail herein. Therefore, the ramp signal $V_{CMP}$ can be a signal that is a sum of currents of the ramp voltage $V_{RMP}$ across a resistor $R_{RMP}$ and of the sense current $I_{SNS}$ (i.e., through a resistor $R_{SCUR}$). The PWM generator 154 can thus generate a digital switching signal PWM having a duty-cycle that is based on the magnitude of the error voltage $V_{ERR}$ relative to the sense current $I_{SNS}$.

Figure 5:
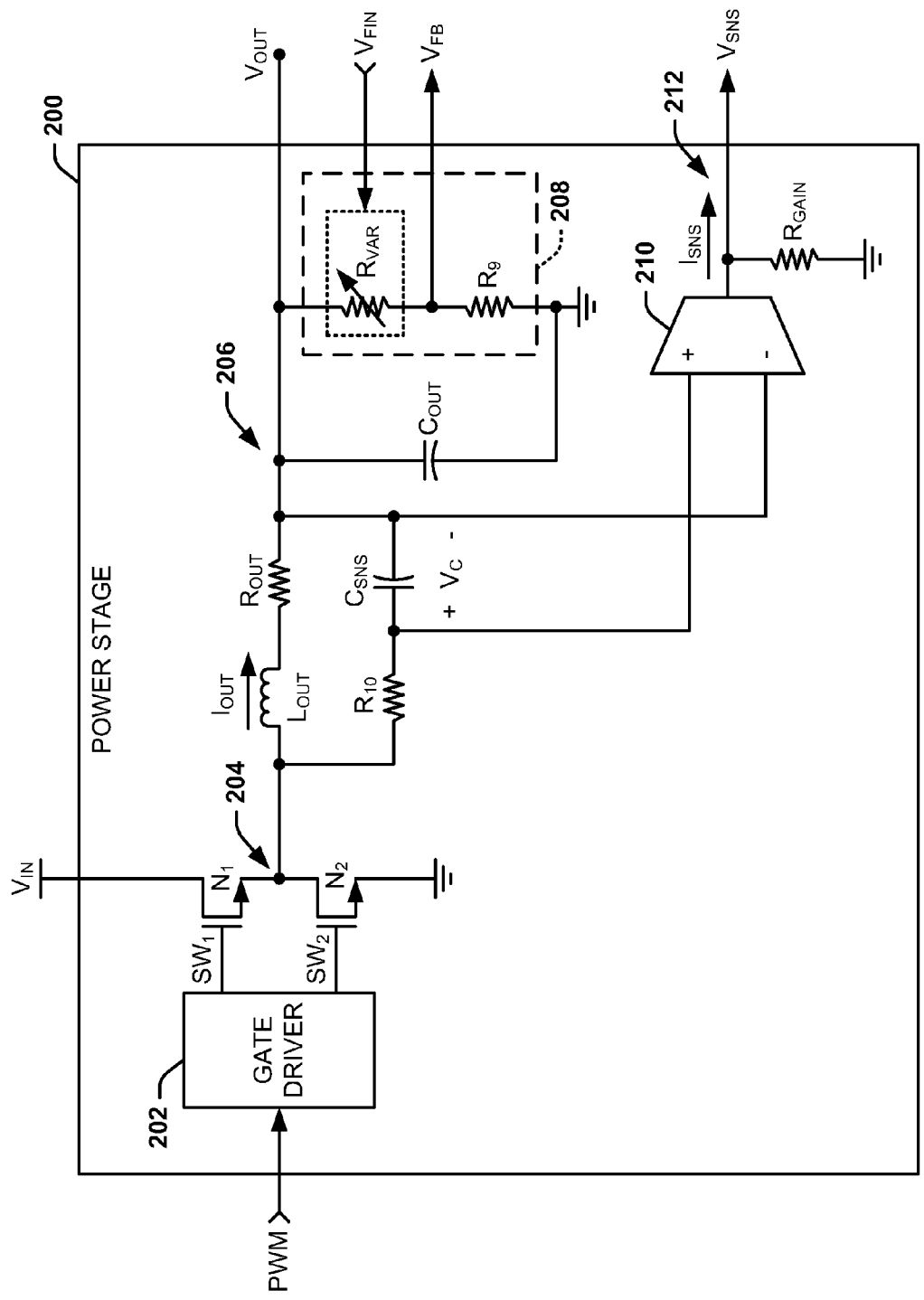
FIG. 5 illustrates an example of a power stage in accordance with an aspect of the invention.

FIG. 5 illustrates an example of a power stage 200 in accordance with an aspect of the invention. The power stage 200 can correspond to the power stage 18 in the example of FIG. 1. Therefore, reference is to be made to the example of FIGS. 1 and 4 in the following description of the example of FIG. 5.

The power stage 200 includes a gate driver 202. The gate driver 202 is configured to generate switching signals $SW_1$ and $SW_2$ in response to the switching signal PWM, such as provided from the PWM generator 154 in the example of FIG. 4. The switching signals $SW_1$ and $SW_2$ are provided to respective transistors $N_1$ and $N_2$. The transistor $N_1$ interconnects an input voltage $V_{IN}$ and a switching node 204 and the transistor $N_2$ interconnects the switching node 204 with a low voltage rail, demonstrated in the example of FIG. 5 as ground. The power stage 200 also includes an inductor $L_{OUT}$ coupled in series with a resistor $R_{OUT}$ that collectively interconnect the switching node 204 and an output 206 on which the output voltage $V_{OUT}$ is provided, and further includes an output capacitor $C_{OUT}$ interconnecting the output 206 and the low voltage rail. Therefore, the power stage 200 in the example of FIG. 5 is configured as a buck-converter that generates the output voltage $V_{OUT}$ based on alternate switching of the transistors $N_1$ and $N_2$ to generate an output current $I_{OUT}$ through the inductor $L_{OUT}$ and the capacitor $C_{OUT}$.

In addition, the power stage 200 includes a voltage divider 208 that includes a variable resistor $R_{VAR}$ interconnecting the output 206 and an intermediate node and a static resistor $R_9$ interconnecting the intermediate node and ground. The voltage divider 208 is configured to generate the feedback voltage $V_{FB}$, such that the feedback voltage $V_{FB}$ has a magnitude that is proportional to the output voltage $V_{OUT}$. The feedback voltage $V_{FB}$ can thus be provided to the error amplifier system, such as the error amplifier system 14 or the error amplifier system 152 in the examples of FIGS. 1 and 4, respectively. In the example of FIG. 5, the variable resistor $R_{VAR}$ has a resistance magnitude that is set based on the fine adjust voltage $V_{FIN}$, which can be the fine adjust voltage $V_{FIN}$ generated by the second DAC 26 based on the digital signal DIG_FIN in the example of FIG. 1. Therefore, the digital signal DIG_FIN can have a value that is selected to change a proportionality of the feedback voltage $V_{FB}$ with respect to the output voltage $V_{OUT}$. Accordingly, the magnitude of the feedback voltage $V_{FB}$ can be adjusted by the digital signal DIG_FIN to make fine adjustments to the desired magnitude of the output voltage $V_{OUT}$.

The power stage 200 also includes a transconductance amplifier 210 that is configured to measure the output current $I_{OUT}$ to generate the sense current $I_{SNS}$. In the example of FIG. 5, the transconductance amplifier 210 has a pair of inputs that are coupled across a capacitor $C_{SNS}$ that is coupled to the output 206 and to a resistor $R_{10}$ that is coupled to the switching node 204. Thus, the transconductance amplifier 210 is configured to generate a sense current $I_{SNS}$ at an output node 212 based on a magnitude of a voltage $V_C$ across the capacitor $C_{SNS}$, with the magnitude of the voltage $V_C$ corresponding to the magnitude of the output current $I_{OUT}$. The sense current $I_{SNS}$ can thus be provided to PWM generator 154, as demonstrated in the example of FIG. 4, to generate the ramp signal $V_{CMP}$, such that the ramp signal $V_{CMP}$ has a magnitude that is based on the output current $I_{OUT}$.

In the example of FIG. 5, a resistor $R_{GAIN}$ interconnects the output node 212 from a low voltage rail, demonstrated in the example of FIG. 5 as ground. The resistor $R_{GAIN}$ is thus a ground-referenced resistor that can have a resistance value that can be implemented to set a current sense level of the power stage 200. As an example, a voltage $V_{SNS}$ at the output 212 can have a magnitude as follows:

$$V_{SNS} = I_{OUT} * R_{OUT} * GM * R_{GAIN} \quad (1)$$

Where: GM is a transconductance value of the transconductance amplifier 210.

Thus, the current sense level (i.e., the sense voltage $V_{SNS}$) can be set based on a single resistor, the resistor $R_{GAIN}$. In addition, because the resistor $R_{GAIN}$ is ground-referenced, noise sensitivity, and thus accuracy, of the power stage 200 can be substantially improved relative to typical power stages. Furthermore, the sense current $I_{SNS}$ output from the transconductance amplifier 210 flows through the resistor $R_{GAIN}$ in an adaptive manner, such that the digital control of the power stage 200 can be provided in a self adaptable and reconfigurable manner.

By implementing the transconductance amplifier 210, the measured magnitude of the output current $I_{OUT}$ can be substantially independent of temperature variation. For example, typical power stages can implement measuring a voltage across a sense resistor to determine output current of the power stage. However, such a configuration is subject to error based on temperature variations, and can be subject to additional power loss based on the portion of the current flow through the sense resistor. By implementing the transconductance amplifier 210 in the power stage 200, the measurement of the output current can be temperature compensated for operation of the power supply system 10 in extreme environments, such as space, for generating a more precise magnitude of the output voltage $V_{OUT}$ in a more efficient manner than typical power supply systems.

It is to be understood that the power stage 200 is not intended to be limited to the example of FIG. 5. For example, while the power stage 200 is demonstrated as a buck-converter, other types of power supplies can be implemented in the power stage, such as boost or buck-boost converters. In addition, the power stage 200 is not limited to implementing two N-type field effect transistors (FETs) for the transistors, but could instead use a single switch, P-type switches, or a combination therein. Therefore, the power stage 100 can be configured in a variety of ways.

Figure 6:
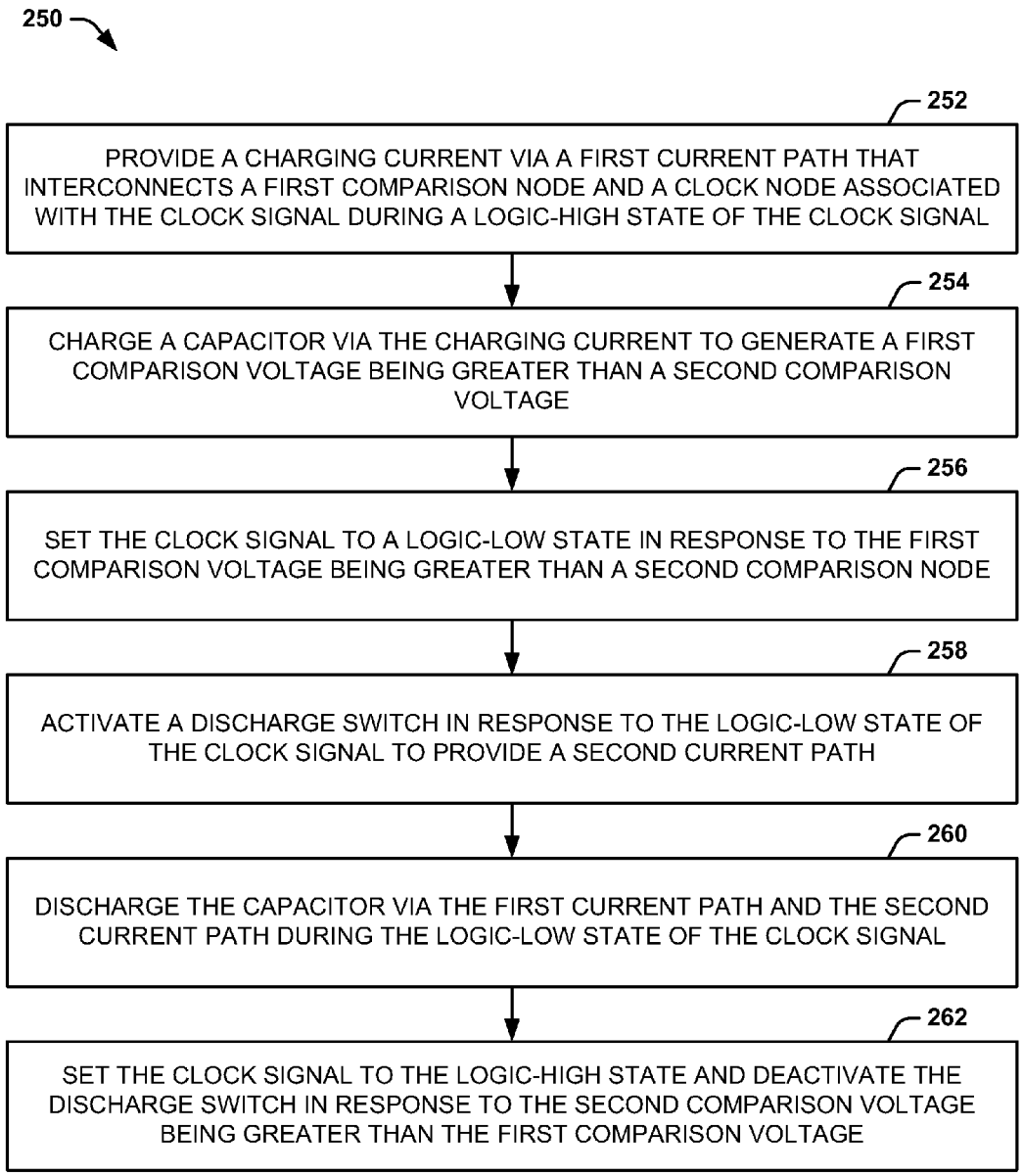
FIG. 6 illustrates an example of a method for generating a clock signal via an oscillator system in accordance with an aspect of the invention.
Figure 7:
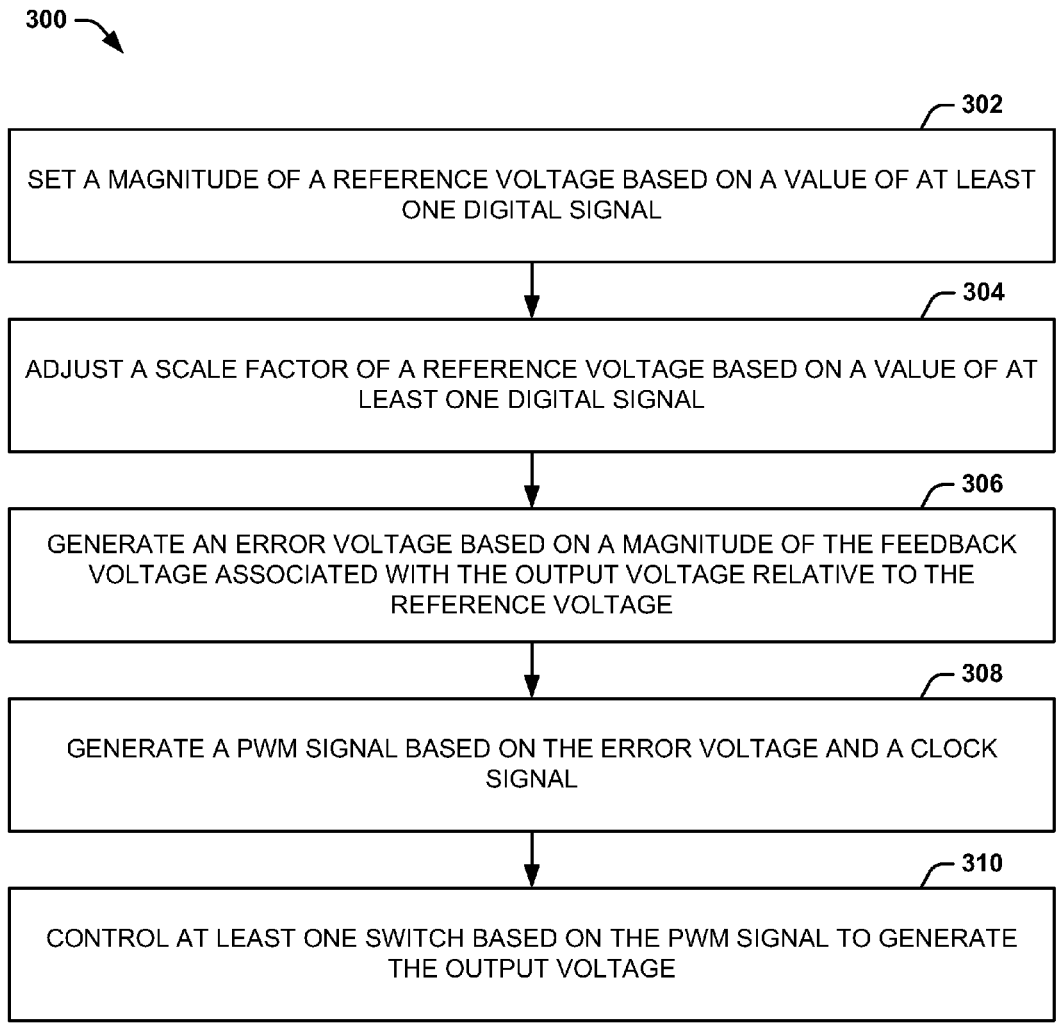
FIG. 7 illustrates an example of a method for generating an output voltage via a power supply system in accordance with an aspect of the invention.

In view of the foregoing structural and functional features described above, certain methods will be better appreciated with reference to FIGS. 6 and 7. It is to be understood and appreciated that the illustrated actions, in other embodiments, may occur in different orders and/or concurrently with other actions. Moreover, not all illustrated features may be required to implement a method.

FIG. 6 illustrates an example of a method 250 for generating a clock signal via an oscillator system in accordance with an aspect of the invention. At 252, a charging current is provided via a first current path that interconnects a first comparison node and a clock node associated with the clock signal during a logic-high state of the clock signal. The charging current can be provided during a logic-high state of the clock signal. The first comparison node can correspond to an input of a comparator and the clock node can correspond to an output of the comparator. At 254, a capacitor is charged via the charging current to generate a first comparison voltage at the first comparison node. The first comparison voltage can increase relatively slowly based on the charging of the capacitor via a single current path.

At 256, the clock signal is set to a logic-low state in response to the first comparison voltage being greater than the second comparison voltage. The second comparison voltage can have a first magnitude during the logic-high state of the clock signal and a second magnitude during the logic-low state of the clock signal, with the first magnitude begin greater than the second magnitude. At 258, a discharge switch is activated in response to the logic-low state of the clock signal to provide a second current path. The discharge switch can be a transistor that is activated by a signal having an inverted state of the clock signal. At 260, the capacitor is discharged via the first current path and the second current path during the logic-low state of the clock signal. The capacitor can discharge more rapidly than charge based on the two discharge current paths, thus resulting in a decrease in the capacitor voltage that is more rapid than the increase. At 262, the clock signal is set to the logic-high state and the discharge switch is deactivated in response to the second comparison voltage being greater than the first comparison voltage. The oscillator system thus repeats operation.

FIG. 7 illustrates an example of a method 300 for generating an output voltage via a power supply system in accordance with an aspect of the invention. At 302, a magnitude of a reference voltage is set based on a value of at least one digital signal. The reference voltage can be set based on a DAC and can correspond to a desired magnitude of the output voltage. At 304, a scale factor of a feedback voltage that is associated with the output voltage is adjusted based on the at least one digital signal. The scale factor of the feedback voltage can be adjusted based on generating a fine adjust voltage via a DAC and using the fine adjust voltage to adjust a resistance of at least one variable resistor in a voltage divider that generates the feedback voltage based on the output voltage. Thus, the reference voltage can thus be adjusted to provide a coarse adjustment to the magnitude of the output voltage and the feedback voltage can be adjusted to provide a fine adjustment to the magnitude of the output voltage.

At 306, an error voltage is generated based on a magnitude of the feedback voltage associated with the output voltage relative to the reference voltage. The error voltage can be generated via an error amplifier. At 308, a PWM signal is generated based on the error voltage and a clock signal. The clock signal can be generated by an oscillator system, such as the oscillator system described in the examples of FIGS. 2, 3, and 6. The PWM signal can be generated by comparing the error voltage with a ramp signal that is generated based on the clock signal. At 310, at least one switch is controlled based on the PWM signal to generate the output voltage. The control of the switch can be based on a duty-cycle of the PWM signal, such as in a buck converter, to generate the output voltage in a power stage. The power stage can include a transconductance amplifier to measure a magnitude of the output current for temperature compensated generation of the ramp signal.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method for generating a clock signal via an oscillator system, the method comprising:
increasing a first comparison voltage at a first comparison node of a comparator from a first magnitude to a second magnitude in response to a first state of a clock signal that is output from the comparator;
increasing a second comparison voltage at a second comparison node of the comparator from approximately the first magnitude to greater than the second magnitude in response to the first state of the clock signal;
changing the clock signal from the first state to a second state in response to the second comparison voltage increasing to a magnitude that is greater than the first comparison voltage;
decreasing the first comparison voltage from the second magnitude to the first magnitude in response to the second state of the clock signal;
decreasing a second comparison voltage from approximately the second magnitude to less than the first magnitude in response to the second state of the clock signal; and
changing the clock signal from the second state to the first state in response to the second comparison voltage decreasing to a magnitude that is less than the first comparison voltage.

2. The method of claim 1, wherein increasing the first comparison voltage comprises increasing the first comparison voltage from the first magnitude to the second magnitude at a first rate, wherein increasing the second comparison voltage comprises increasing the second comparison voltage from approximately the first magnitude to the second magnitude at a second rate, wherein decreasing the first comparison voltage comprises decreasing the first comparison voltage from the second magnitude to the first magnitude at the first rate, wherein decreasing the second comparison voltage comprises decreasing the second comparison voltage from approximately the second magnitude to the first magnitude at a third rate, wherein the first rate is faster than the second rate and the third rate is faster than the second rate.

3. The method of claim 1, wherein increasing the first comparison voltage comprises increasing the first comparison voltage from the first magnitude to the second magnitude based on a first feedback path that interconnects an output of a comparator and the first comparison node, and wherein increasing the second comparison voltage comprises increasing the second comparison voltage from approximately the first magnitude to greater than the second magnitude based on a second feedback path that interconnects the output of a comparator and the second comparison node.

4. The method of claim 3, wherein decreasing the second comparison voltage comprises decreasing the second comparison voltage from approximately the second magnitude to less than the first magnitude based on the second feedback path and based on a discharge switch that interconnects the second comparison node and a low-voltage rail and which is activated in response to the second state of the clock signal.

5. The method of claim 1, wherein increasing the second comparison voltage comprises:
providing a charging current via a first current path that interconnects the second comparison node and a clock node associated with the clock signal during the first state of the clock signal; and
charging a capacitor via the charging current to generate the second comparison voltage at the second comparison node.

6. The method of claim 5, wherein decreasing the second comparison voltage comprises:
activating a discharge switch in response to the second state of the clock signal to provide a second current path;
discharging the capacitor via the first current path and the second current path during the logic-low state of the clock signal.

7. The method of claim 6, further comprising deactivating the discharge switch in response to the first state of the clock signal.

8. The method of claim 1, wherein increasing the first comparison voltage comprises increasing the first comparison voltage in response to the clock signal being set to the first state via a feedback current path that interconnects the first comparison node and the clock node, and wherein decreasing the first comparison voltage comprises decreasing the first comparison voltage in response to the clock signal being set to the second state via the feedback current path.

9. The method of claim 1, wherein the oscillator system is configured as at least a portion of an integrated circuit (IC), the method further comprising providing the capacitor as an external capacitor with respect to the IC, a frequency of the clock signal being adjustable based on a capacitance of the capacitor absent a resistive circuit element.

10. A power supply system configured to implement the method of claim 1 to generate an output voltage based on the clock signal.

11. A method for generating a clock signal via an oscillator system, the method comprising:
providing a charging current via a first current path that interconnects a first comparison node and a clock node associated with the clock signal during a logic-high state of the clock signal;
charging a capacitor via the charging current to generate a first comparison voltage at the first comparison node;
setting the clock signal to a logic-low state in response to the first comparison voltage being greater than a second comparison voltage;
activating a discharge switch in response to the logic-low state of the clock signal to provide a second current path;
discharging the capacitor via the first current path and the second current path during the logic-low state of the clock signal; and
setting the clock signal to the logic-high state and deactivating the discharge switch in response to the second comparison voltage being greater than the first comparison voltage.

12. The method of claim 11, further comprising:
decreasing the second comparison voltage in response to the clock signal being set to the logic-low state via a feedback current path that interconnects the second comparison node and the clock node; and
increasing the second comparison voltage in response to the clock signal being set to the logic-high state via the feedback current path.

13. The method of claim 11, wherein the oscillator system is configured as at least a portion of an integrated circuit (IC), the method further comprising providing the capacitor as an external capacitor with respect to the IC, a frequency of the clock signal being adjustable based on a capacitance of the capacitor absent a resistive circuit element.

14. A power supply system configured to implement the method of claim 11 to generate an output voltage based on the clock signal.

* * * * *

UNITED STATES PATENT AND TRADEMARK OFFICE
CERTIFICATE OF CORRECTION

PATENT NO. : 9,143,028 B2
APPLICATION NO. : 14/517695
DATED : September 22, 2015
INVENTOR(S) : F. Dong Tan et al.

Page 1 of 1

It is certified that error appears in the above-identified patent and that said Letters Patent is hereby corrected as shown below:

Title Page

(74) Attorney, Agent, or Firm - "Sundhelm" should read --Sundheim--

Signed and Sealed this
Twenty-third Day of February, 2016

Michelle K. Lee
*Director of the United States Patent and Trademark Office*